United States Patent [19]

Chiang

[11] Patent Number: 5,739,047
[45] Date of Patent: Apr. 14, 1998

US005739047A

[54] METHOD OF FABRICATING A VOIDLESS IC ELECTRICAL PLUG

[75] Inventor: Shing-Shing Chiang, Hsinchu Hsien, Taiwan

[73] Assignee: Winbond Electronics Corporation, Taiwan

[21] Appl. No.: 691,313

[22] Filed: Aug. 2, 1996

[30] Foreign Application Priority Data

Jun. 17, 1996 [TW] Taiwan .................. 85107278

[51] Int. Cl.⁶ .................................................. H01L 21/44
[52] U.S. Cl. ................... 437/192; 437/195; 437/203
[58] Field of Search ...................... 437/203, 192, 437/195

[56] References Cited

U.S. PATENT DOCUMENTS

| | | | |
|---|---|---|---|
| 4,822,753 | 4/1989 | Pintchowski | 437/192 |
| 4,961,822 | 10/1990 | Liao | 156/656 |
| 5,633,189 | 5/1997 | Yen | 438/600 |

*Primary Examiner*—John Niebling
*Assistant Examiner*—Brendan Mee
*Attorney, Agent, or Firm*—Rabin, Champagne & Lynt, P.C.

[57] ABSTRACT

A method of fabricating a IC electrical plug, which removes an overhang to prevent formation of voids inside the plug. A transistor with a gate and source/drain terminals is formed on a silicon substrate. A dielectric layer is formed above the silicon substrate. A portion of the dielectric layer is removed by etching to form a contact window, exposing the source region, the drain region, or another conductive material region. A first diffusion barrier layer is formed at the bottom and on the sidewalls of the contact window, and on the top surface of the dielectric layer, overhanging the contact window. A photoresist layer is coated over the substrate filling up the contact window and covering the surface of first diffusion barrier layer. An isotropic etching process is performed to etch away portions of the photoresist layer and the first diffusion barrier layer, exposing the surface of dielectric layer, and leaving the height of the aforementioned layers inside the contact window below the top surface of the dielectric layer. The remaining photoresist layer inside the contact window is removed. A second diffusion barrier layer is formed on the exposed upper sidewalls of the contact window, extending to cover the top surface of the dielectric layer as well. A layer of conductive material filling up the contact window then forms the electrical plug.

20 Claims, 6 Drawing Sheets

5,739,047

METHOD OF FABRICATING A VOIDLESS IC ELECTRICAL PLUG

BACKGROUND OF THE INVENTION

1. Field of the Invention

The invention relates in general to the fabrication of an IC component, and more particularly to the fabrication of an IC electrical plug having a void-free structure.

2. Description of the Related Art

As the level of integration of integrated circuits increases, there is less and less surface area available on the silicon chip for the formation of necessary component interconnects. To meet the need for the growing number of interconnects required when MOS transistors are miniaturized, designs having two or more metallic layers are gradually becoming a necessity. Particularly, for functionally sophisticated products such as microprocessors, several metallic layers are required to provide interconnects among various components. One way of achieving inter-metallic layer connection is through the use of an electrical plug.

Generally, to fabricate an electrical plug, a contact window is first etched from a dielectric layer (for example, a silicon dioxide layer). Then, conductive material, such as the most commonly used material, tungsten, is utilized to fill up the contact window. Due to poor adhesive strength between the conductive material and the dielectric layer, it is necessary to form an intermediate layer of material between the two to act as a glue and as a barrier. The most common intermediate glue/barrier layer materials are titanium(Ti)/titanium nitride(TiN) and titanium tungsten(TiW), formed by a physical vapor deposition (PVD) method. Because the step coverage ability of the PVD method is poor, problems caused by voids arise.

To get a better understanding of the process of fabricating a conventional electrical plug and to explain the shortcomings of this process, an example is given below.

FIGS. 1A to 1D are cross-sectional views showing the conventional process flow for fabricating an electrical plug.

First, referring to FIG. 1A, a transistor with gate and source/drain regions (not shown) is formed above a silicon substrate 10 by the conventional processing method. Then, an inter-layer dielectric (ILD) 14 is formed above the silicon substrate 10. This ILD may be, for example, borophosphosilicate glass (BPSG). Next, a portion of the dielectric layer 14 is removed by etching, forming a contact window 16 exposing a region of conductive material 12, such as a source or drain region. The contact window 16 is formed, for example, by a dry etching method.

Next, referring to FIG. 1B, a diffusion barrier layer 18 is formed at the bottom and on the sidewalls of the contact window 16. The diffusion barrier layer 18 extends in both directions above the dielectric layer 14. That is, it extends upward from the top surface of the ILD 14, and also extends in toward the contact window 16. An example construction of the diffusion barrier layer 18 is a composite layer structure made by first forming a layer of titanium (Ti) 20 on the ILD and bottom of the contact window 16, followed by a layer of titanium nitride (TiN) 22. These layers may be formed using a physical vapor deposition (PVD) method. The composite layer structure serves two functions: diffusion prevention and adhesive strength enhancement. However, due to its poor step coverage ability, formation of the diffusion barrier layer results in overhangs 23 on the upper sidewalls of the contact window 16.

Then, referring to FIG. 1C, a blanket of tungsten 24 is formed by a process such as chemical vapor deposition (CVD) to fill up the contact window, extending to cover the diffusion barrier layer 18 as well. Because of the overhangs 23 mentioned earlier, a void 26 is formed within the contact window when the tungston 24 is deposited.

Lastly, referring to FIG. 1D, the blanket of tungsten 24 is etched back to a predetermined level to form a tungsten plug 28.

In the aforementioned process for fabricating an IC electrical plug, a diffusion barrier layer with a glue/barrier function is first formed by PVD prior to the filling of conductive material into the contact window within the dielectric layer. Because of poor step coverage in the PVD process, an overhang phenomenon occurs, resulting in the subsequent generation of voids when the conductive material is deposited. The presence of the void not only raises the electrical resistance of the plug, but also may lead to an open circuit situation if the voids are large enough. Thus, the void formation has a serious effect on the functionality of the overall component.

SUMMARY OF THE INVENTION

It is therefore an object of the invention to provide a method for fabricating an IC electrical plug such that the overhang portion of a diffusion barrier layer is removed and a second thin diffusion barrier layer is deposited in its place, so as to prevent void formation in a subsequent conductive material filling process.

To achieve the object stated above, the invention provides a method for fabricating an IC electrical plug which includes the following steps. A transistor with gate and source/drain terminals is formed on a silicon substrate. A dielectric layer is then formed on the silicon substrate. A portion of the dielectric layer is removed by etching to form a contact window exposing either the source or drain region. A first diffusion barrier layer is formed at the bottom and on the sidewalls of the contact window. The first diffusion barrier layer extends upward from the top surface of the dielectric layer, as well as in toward the contact window. A photoresist layer is then filled into the contact window and covers the surface of first diffusion barrier layer. An isotropic etching process is performed to etch away portions of the photoresist layer and the first diffusion barrier layer, exposing the surface of the dielectric layer, and leaving the height of the aforementioned layers inside the contact window below the upper surface of the dielectric layer. The remaining photoresist layer inside the contact window is then removed. A second diffusion barrier layer is formed on the exposed upper sidewalls of the contact window. The second diffusion barrier layer extends to cover the dielectric layer as well. A layer of conductive material filling up the contact window is formed, resulting in the formation of an electrical plug.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

FIGS. 2A to 2H are cross-sectional views showing the processing flow of fabricating an IC electrical plug according to one preferred embodiments of this invention.

Figure 1A:
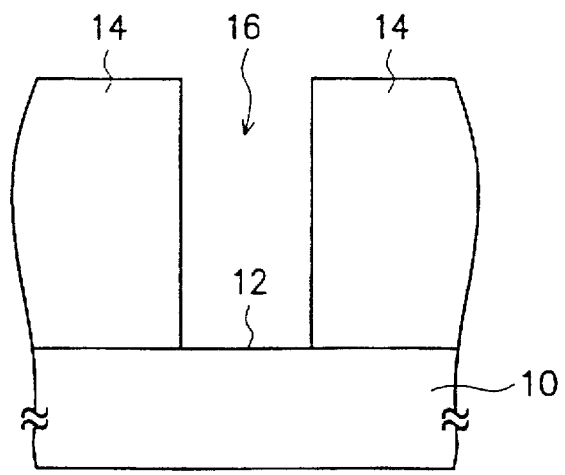
FIGS. 1A to 1D are cross-sectional views showing the conventional processing flow of fabricating an IC electrical plug.
Figure 1B:
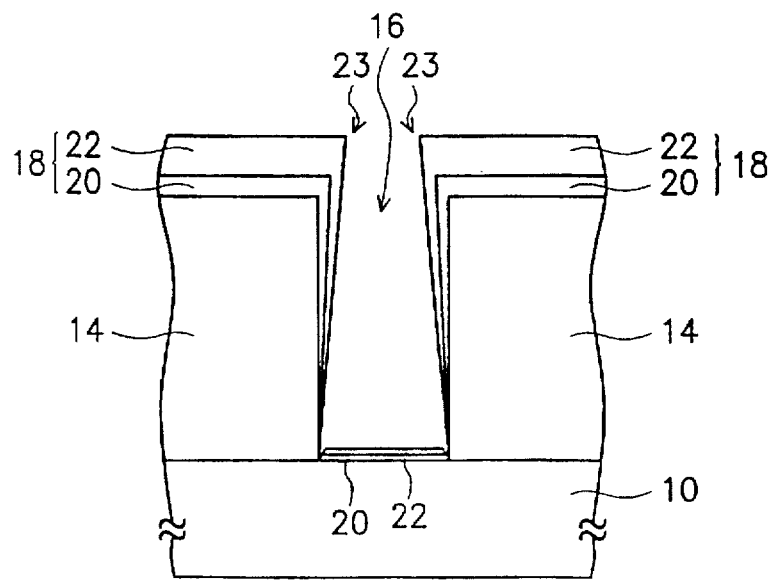
Figure 1C:
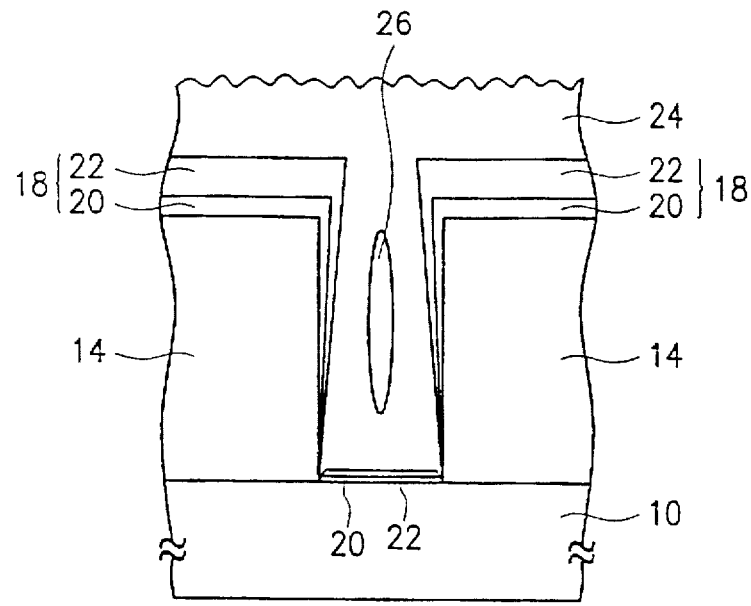
Figure 1D:
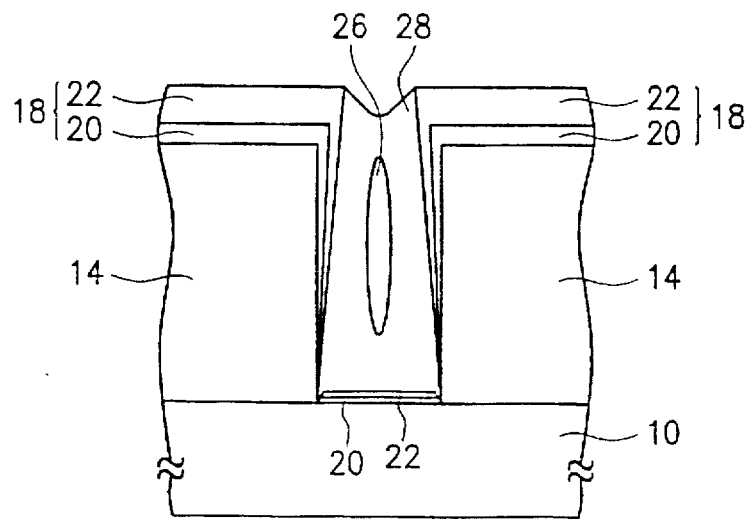
Figure 2A:
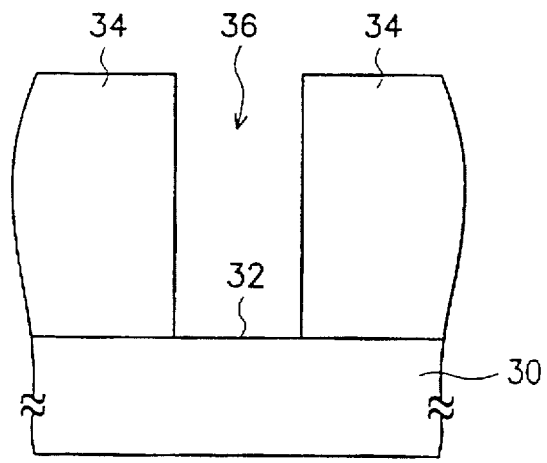
FIGS. 2A to 2H are cross-sectional views showing the processing flow of fabricating an IC electrical plug according to one preferred embodiments of this invention.

First, referring to FIG. 2A, a transistor with gate and source/drain terminals is formed on the silicon substrate 30 by a conventional processing method. Then, a dielectric layer 34 is formed above the silicon substrate 30. For example, this dielectric layer can be a deposition of boro-phosphosilicate glass with a thickness of about 5000 Å. After that, a portion of the dielectric layer 34 is removed to form a contact window 36, preferably about 0.5 µm×0.5 µm in size, exposing a region of conductive material 32, such as a source/drain region, a gate region, or a metallic material region. The method employed to remove the dielectric layer 34 and form the opening can be a photolithographic process combined with dry etching method.

Figure 2B:
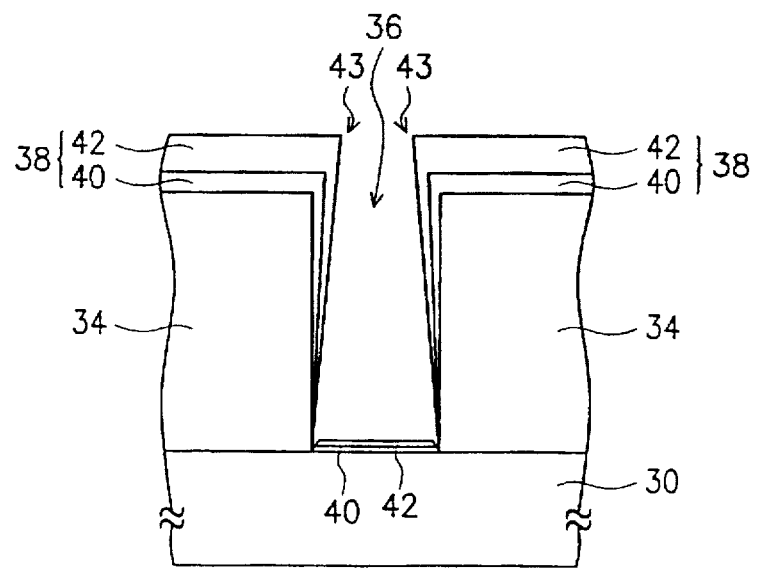

Next, referring to FIG. 2B, a first diffusion barrier layer 38 is formed at the bottom and on the sidewalls of the contact window 36. The first diffusion barrier layer 38 also extends upward from the top surface of the dielectric layer 34, and in toward the contact window. The first diffusion barrier layer 38 may be, for example, a composite layer structure made by first forming a layer of titanium (Ti) 40 with a thickness of about 600 Å, followed by a layer of titanium nitride (TiN) 42 with a thickness of about 1000 Å. Both layers 40 and 42 may be formed using a physical vapor deposition (PVD) process. Because of poor step coverage in the PVD process, overhangs 43 are formed over the upper sidewalls of the contact window 36.

Figure 2C:
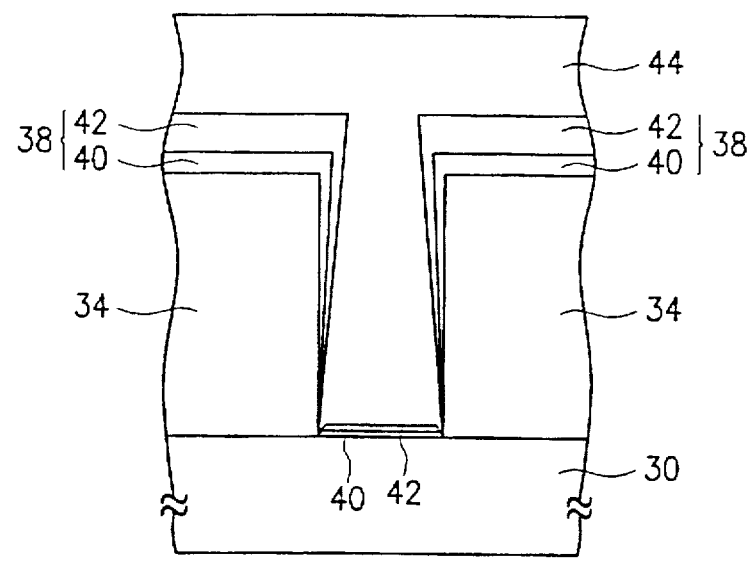

Then, referring to FIG. 2C, a photoresist layer 44 is coated over the substrate 30, filling up the contact window 36 and covering the surface of the first diffusion barrier layer 38, with a thickness of between about 2000 Å and about 8000 Å.

Figure 2D:
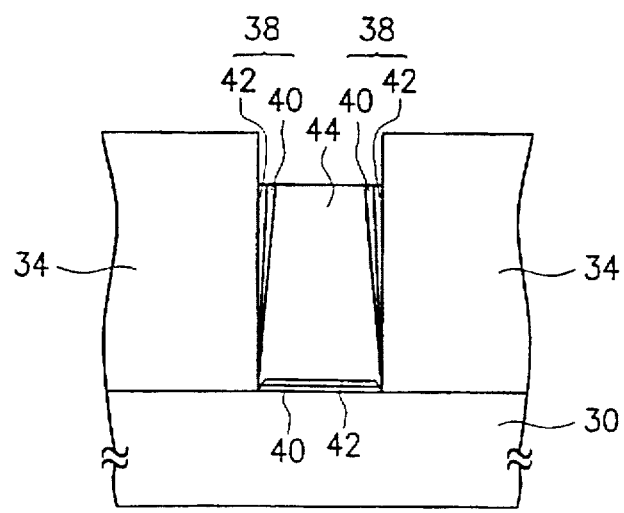

Thereafter, referring to FIG. 2D, an isotropic dry etching process is performed to etch away portions of the photoresist layer 44 and the first diffusion barrier layer 38, exposing the surface of dielectric layer 34 while removing the overhang portions 43. This has the effect of leaving the height of the layers 38 and 44 within the contact window 36 at a level that is below the top surface of dielectric layer 34, while exposing only a height of less than about 2000 Å of the upper sidewalls of the contact window 36.

Figure 2E:
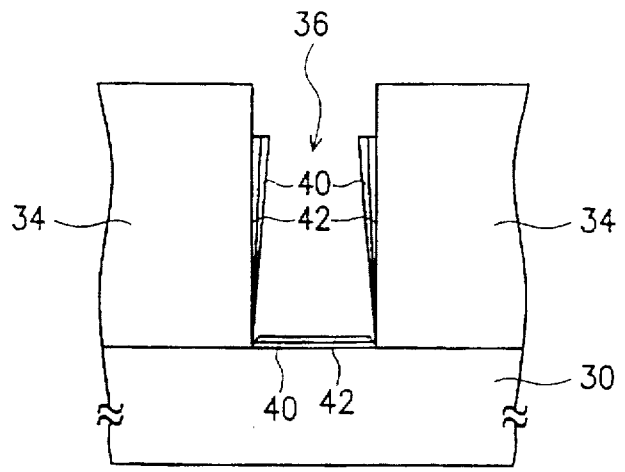
Figure 2F:
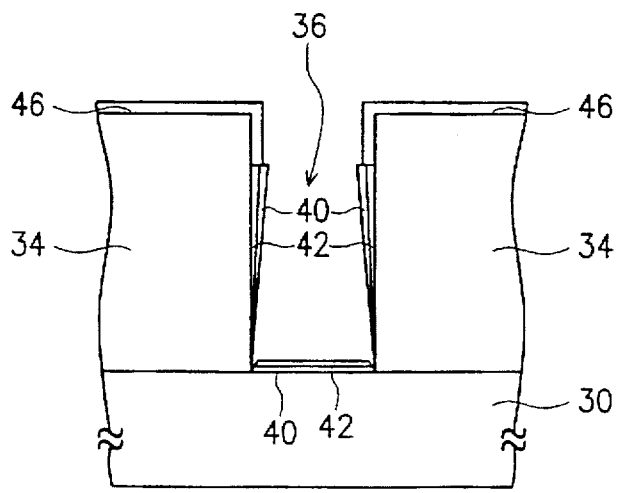

Next, referring to FIG. 2E, the remaining portion of the photoresist layer 44 inside the contact window 36 is removed by using a solvent such as acetone. Subsequently, referring to FIG. 2F, a second diffusion barrier layer 46 is formed on the exposed upper sidewalls of the contact window 36. The second diffusion barrier layer 46 extends to cover the dielectric layer 34 as well. For example, a sputtering method can be utilized to form a layer of titanium nitride (TiN) having a thickness of less than about 200 Å.

Figure 2G:
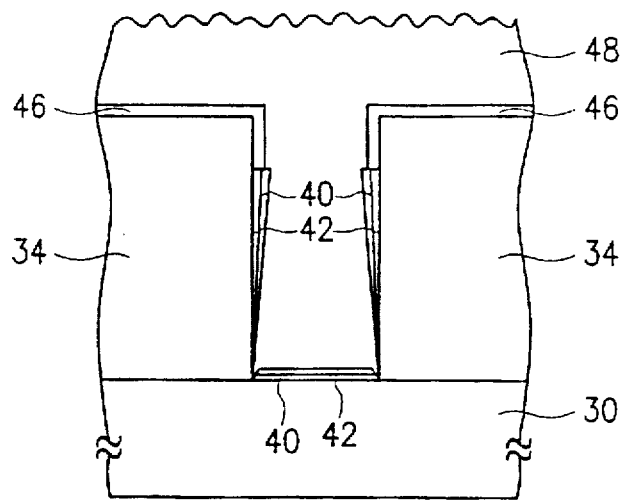

Referring to FIG. 2G, a layer of conductive material 48 is formed over the substrate 30, filling up the contact window 36 and extending to cover the second diffusion barrier layer 46. For example, a blanket of tungsten may be formed by a chemical vapor deposition process.

Figure 2H:
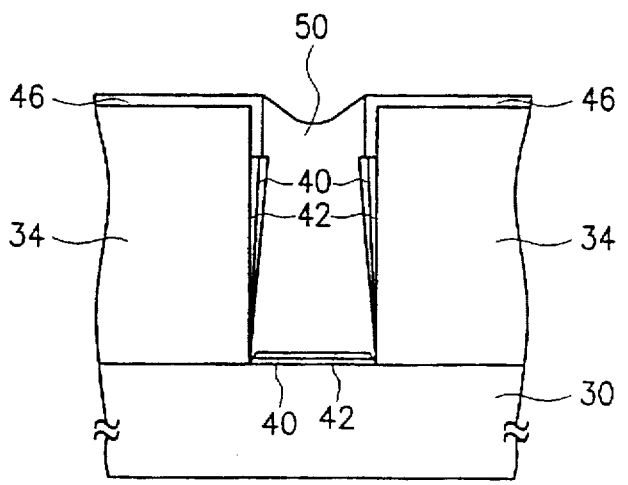

Referring to FIG. 2H, the conductive material 48 is etched back, exposing the second diffusion barrier layer 46, and an electrical plug 50 is formed inside the contact window. For example, the electric plug 50 may be a tungsten plug.

In summary, according to the preferred embodiment of the invention, by etching away portions of the overhangs in the first diffusion barrier layer, followed by depositing a second diffusion barrier layer to replace the lost overhang portions, the contact window can be filled with a conducting material to form an electrical plug that is free from any voids.

While the invention has been described by way of example and terms of a preferred embodiment, it is to be understood that the invention is not limited thereto. To the contrary, it is intended to cover various modifications and similar arrangements. The appended claims, therefore, should be accorded the broadest interpretation, so as to encompass all such modifications and similar structures.

What is claimed is:

1. A method of fabricating an IC electrical plug that is free of voids, comprising the steps of:

forming a transistor having a gate and a source/drain region on a silicon substrate;

forming a dielectric layer above the silicon substrate;

etching away a portion of the dielectric layer to form a contact window exposing a conductive material region of the silicon substrate;

forming a first diffusion barrier layer at the bottom and on the sidewalls of the contact window, and on a top surface of the dielectric layer overhanging the contact window;

coating a photoresist layer over the silicon substrate, filling up the contact window and covering the surface of the first diffusion barrier layer;

performing an isotropic etching process to etch away portions of the photoresist layer and the first diffusion barrier layer, to expose the surface of the dielectric layer, so as to leave the heights of the first diffusion barrier layer and the photoresist layer inside the contact window at a level that is below the top surface of the dielectric layer;

removing the remaining photoresist layer inside the contact window;

forming a second diffusion barrier layer on the exposed upper sidewalls of the contact window and on the top surface of the dielectric layer; and forming a conductive layer filling up the contact window, serving as the electrical plug.

2. A method according to claim 1, wherein the dielectric layer comprises boro-phosphosilicate glass having a thickness of about 5000 Å.

3. A method according to claim 1, wherein the first diffusion barrier layer is a titanium/titanium nitride composite layer.

4. A method according to claim 1, wherein the thickness of the photoresist layer is between about 2000 Å and about 8000 Å.

5. A method according to claim 1, wherein, after performing the isotropic etching process, the height of exposed upper sidewalls of the contact window is less than about 2000 Å.

6. A method according to claim 1, wherein the second diffusion barrier layer is a titanium nitride layer having a thickness of less than about 200 Å.

7. A method according to claim 1, wherein the conductive layer comprises tungsten.

8. A method according to claim 1, wherein the conductive material region is a source/drain region.

9. A method according to claim 1, wherein the conductive material region is a gate region.

10. A method according to claim 1, wherein the conductive material region is a metallic material region.

11. A method of fabricating an IC electrical plug, comprising the steps of:

forming a conductive material region on a substrate;

forming a dielectric layer above the substrate;

removing a portion of the dielectric layer to form a contact window exposing the conductive material region;

forming a first diffusion barrier layer at the bottom and on the sidewalls of the contact window, and on a top surface of the dielectric layer overhanging the contact window;

coating a photoresist layer over the substrate, filling up the contact window and covering the surface of the first diffusion barrier layer;

removing portions of the photoresist layer and the first diffusion barrier layer, to expose the top surface of dielectric layer and upper sidewalls of the dielectric layer in the contact window;

removing the remaining photoresist layer inside the contact window;

forming a second diffusion barrier layer on the exposed upper sidewalls of the contact window and on the top surface of the dielectric layer; and forming a conductive layer inside the contact window, serving as the electrical plug.

12. A method according to claim 11, wherein the dielectric layer comprises boro-phosphosilicate glass having a thickness of about 5000 Å.

13. A method according to claim 11, wherein the first diffusion barrier layer is a titanium/titanium nitride composite layer.

14. A method according to claim 11, wherein the thickness of the photoresist layer is between about 2000 Å and about 8000 Å.

15. A method according to claim 11, wherein, after removing portions of the photoresist layer and the first diffusion barrier layer, the height of the exposed upper sidewalls of the contact window is less than about 2000 Å.

16. A method according to claim 11, wherein the second diffusion barrier layer is a titanium nitride layer having a thickness of less than about 200 Å.

17. A method according to claim 11, wherein the conductive layer comprises tungsten.

18. A method according to claim 11, wherein the conductive material region is a transistor source/drain region.

19. A method according to claim 11, wherein the conductive material region is a transistor gate region.

20. A method according to claim 11, wherein the conductive material region is a metallic material region.

* * * * *